(12) United States Patent
Chuang et al.

(10) Patent No.: US 10,038,137 B2
(45) Date of Patent: Jul. 31, 2018

(54) MRAM DEVICE AND METHOD FOR FABRICATING THE SAME

(71) Applicant: Taiwan Semiconductor Manufacturing Co., Ltd., Hsinchu (TW)

(72) Inventors: Harry-Hak-Lay Chuang, Singapore (SG); Sheng-Haung Huang, Hsinchu (TW); Hung-Cho Wang, Taipei (TW); Kuei-Hung Shen, Hsinchu (TW); Shy-Jay Lin, Jhudong Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/281,428

(22) Filed: Sep. 30, 2016

(65) Prior Publication Data

US 2018/0097175 A1 Apr. 5, 2018

(51) Int. Cl.
| | |
|---|---|
| *H01L 27/22* | (2006.01) |
| *H01L 43/12* | (2006.01) |
| *H01L 43/08* | (2006.01) |
| *H01L 43/02* | (2006.01) |

(52) U.S. Cl.
CPC ............ *H01L 43/08* (2013.01); *H01L 27/222* (2013.01); *H01L 43/12* (2013.01); *H01L 43/02* (2013.01)

(58) Field of Classification Search
CPC ....... H01L 27/222; H01L 43/12; H01L 43/08; Y10T 29/53165
See application file for complete search history.

(56) References Cited

U.S. PATENT DOCUMENTS

| | | | | |
|---|---|---|---|---|
| 2008/0062580 | A1* | 3/2008 | Inokuchi | B82Y 25/00 360/324.2 |
| 2012/0205764 | A1* | 8/2012 | Chen | G11C 11/16 257/422 |
| 2013/0119494 | A1* | 5/2013 | Li | H01L 43/08 257/421 |
| 2016/0027843 | A1* | 1/2016 | Kumura | H01L 27/228 257/295 |

* cited by examiner

*Primary Examiner* — Caridad Everhart
(74) *Attorney, Agent, or Firm* — Birch, Stewart, Kolasch & Birch, LLP

(57) ABSTRACT

A semiconductor device structure is provided. The semiconductor device structure includes a magnetoresistive random access memory (MRAM) device in an insulating layer. The MRAM device includes a first electrode, a magnetic tunnel junction (MTJ) over the first electrode, a second electrode over the MTJ, and an insulating spacer surrounding sidewalls of the first electrode, the MTJ, and the second electrode. Top surfaces of the insulating spacer and the second electrode are exposed from the insulating layer. The semiconductor device structure also includes a conductive pad over the insulating layer and electrically connected to the second electrode. The MTJ is entirely covered by the conductive pad.

20 Claims, 17 Drawing Sheets

MRAM DEVICE AND METHOD FOR FABRICATING THE SAME

BACKGROUND

Semiconductor memory devices are used in integrated circuits for electronic applications, including cell phones, personal computer device, and televisions, as exampled. Commonly known memory devices include charge-storing devices, such as dynamic random access memory (DRAM) devices or flash memory devices.

A more recent development in memory devices involves magnetoresistive random access memory (MRAM) devices, in which data is stored by magnetic storage elements. The magnetic storage elements typically include two ferromagnetic layers that are separated by a thin tunnel barrier layer. For example, a magnetic tunnel junction (MTJ) is a component in the MRAM device and includes two magnetic layers separated by a thin tunnel barrier layer as mentioned above. In such an MTJ, a first magnetic layer is referred to as a fixed/pinned layer, while a second magnet layer is referred to as a free layer. On top of the MTJ, a conductive electrode typically provides a contact for electrically connecting to an interconnect structure (e.g., a conductive line and/or a conductive plug) and is fabricated during the MRAM back-end of line (BEOL) process.

However, with the development of new MRAM devices and the continuous shrinking of MTJ sizes, fabrication processes continue to become more difficult to perform and new challenges are being discovered.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
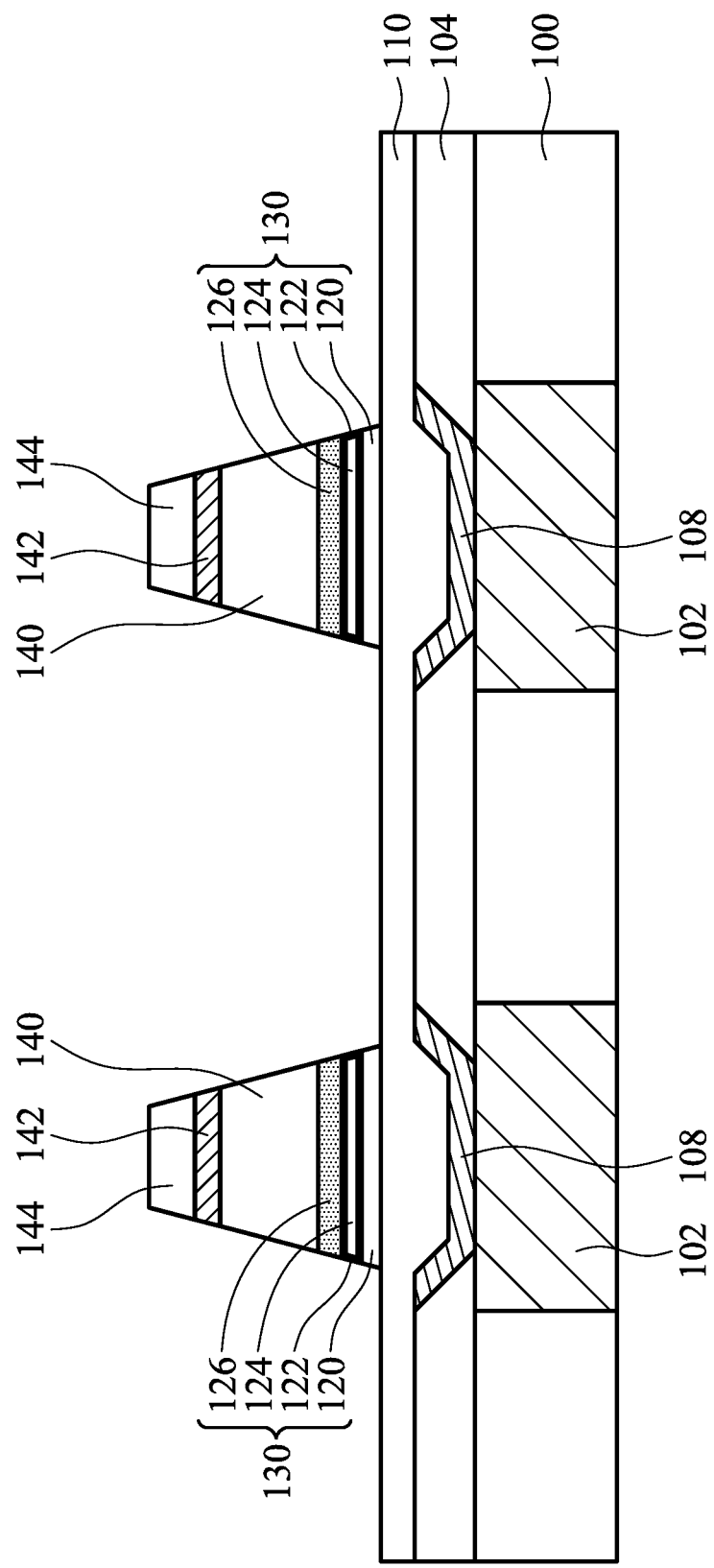
FIGS. 1A to 1J are cross-sectional views of various stages of a method for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor device structures and methods for forming the same are provided in accordance with exemplary embodiments. The intermediate stages of forming the semiconductor device structures in accordance with embodiments are illustrated. The various embodiments are discussed, in which like reference numbers are used to designate like elements.

Some embodiments of the disclosure are described. FIGS. 1A to 1J are cross-sectional views of various stages of a method for forming a semiconductor device structure, in accordance with some embodiments. Additional operations can be provided before, during, and/or after the stages described in FIGS. 1A to 1J. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, a device wafer (not shown) is provided, in accordance with some embodiments. The device wafer may include a substrate. The substrate is made of a semiconductor material, such as silicon. A variety of device elements may be formed in or over the semiconductor substrate. Such device elements may include active devices (such as transistors) and/or passive devices (such as resistors and/or capacitors).

As shown in FIG. 1A, an interconnect structure is formed over the substrate, in accordance with some embodiments. The interconnect structure may include one or more insulating layers. For example, the interconnect structure may include an insulating layer 100 formed over the substrate. In some embodiments, the insulating layer 100 is used as an inter-metal dielectric (IMD) layer and includes silicon oxide, borosilicate glass (BSG), phosphoric silicate glass (PSG), borophosphosilicate glass (BPSG), fluorinated silicate glass (FSG), tetraethyl orthosilicate (TEOS) oxide, or a combination thereof. Alternatively, the insulating layer 100 may include low-k material or porous dielectric material having low k value. The k value of the low-k dielectric material or porous dielectric material may be lower than about 3.0, or lower than about 2.5, for example. In some embodiments, the insulating layer 100 is formed by a chemical vapor deposition (CVD) process, a low-pressure CVD (LPCVD) process, a plasma-enhanced CVD (PECVD) process, a high-density plasma CVD (HDPCVD) process, a spin-on process, or another suitable method.

First conductive features are formed in the insulating layer 100, in accordance with some embodiments. In order to simplify the diagram, only two adjacent first conductive features 102 are depicted. In some embodiments, the first conductive feature 102 may be a conductive line, a conductive via or a combination thereof. For example, the first conductive feature 102 is a metal line, such as a copper line, and is used for interconnecting the overlying and underlying devices and/or metal lines. In some embodiments, the conductive feature 102 that is made of metal is formed by a PVD process, a CVD process, an atomic layer deposition (ALD) process, or another suitable method.

As shown in FIG. 1A, a second interconnect structure is formed over the first interconnect structure, in accordance with some embodiments. The second interconnect structure may include one or more insulating layers. For example, an insulating layer 104 is formed over the insulating layer 100. In some embodiments, the insulating layer 104 is used as an IMD layer and includes silicon oxide (e.g., silicon-rich oxide (SRO)), silicon nitride, a silicon oxynitride, a silicon carbide, or a combination thereof. In some embodiments, the insulating layer 104 is formed by a CVD process, an LPCVD process, a PECVD process, a HDPCVD process, a spin-on process, or another suitable method. In some embodiments, the insulating layer 104 is etched to form openings, thereby exposing the underlying first conductive features 102.

Figure 1B:
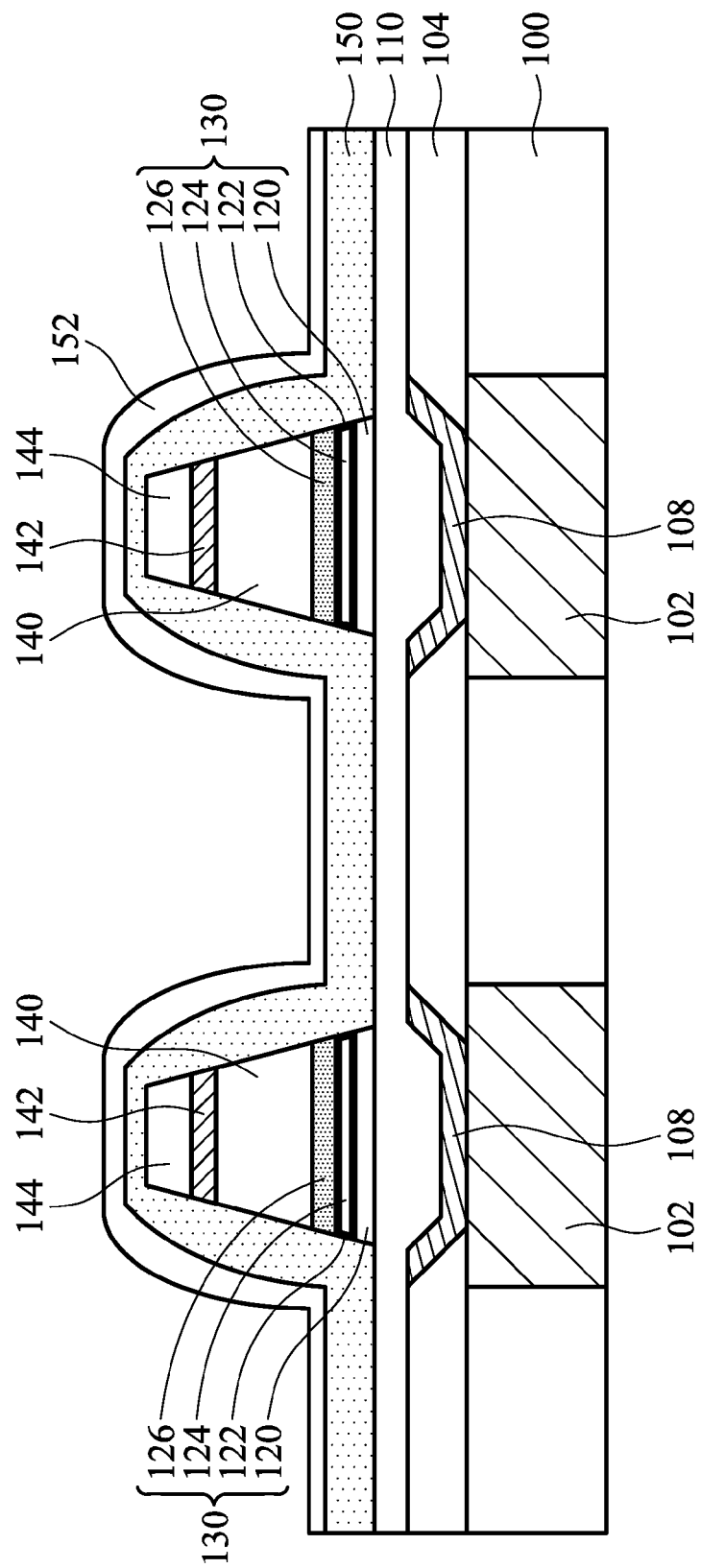
Figure 1C:
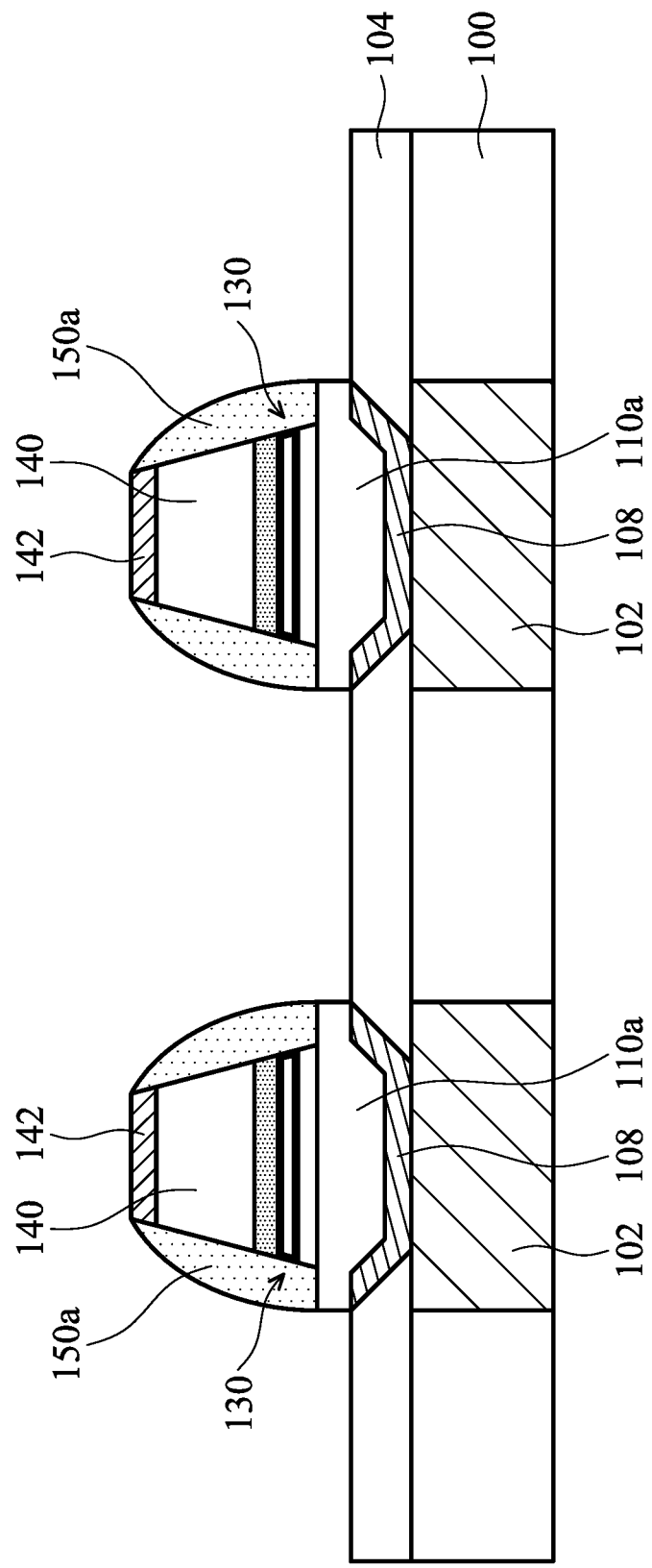

As shown in FIGS. 1A to 1C, MRAM devices are correspondingly formed over the first conductive features 102, in accordance with some embodiments. In some embodiments, the MRAM device at least includes electrodes and an MTJ therebetween.

In FIG. 1A, in some embodiments, a first electrode layer 110 is formed over the first interconnect structure and fills the openings of the insulating layer 104, so as to be electrically connected to the first conductive features 102 thereunder. The first electrode layer 110 may be made of titanium nitride (TiN), tantalum nitride (TaN), copper, aluminum, tungsten, tantalum, titanium, or a combination thereof. In some embodiments, the first electrode layer 110 may be formed by a PVD process, a CVD process, an ALD process, or another suitable method.

In some embodiments, a diffusion barrier layer 108 is conformally formed on the sidewall and bottom of each opening of the insulating layer 104 prior to the formation of the first electrode layer 110. The diffusion barrier layer 108 may be made of tantalum, titanium, TaN, TiN, or a combination thereof. In some embodiments, the diffusion barrier layer 108 may be formed by a PVD process, a CVD process, an ALD process, or another suitable method.

As shown in FIG. 1A, in some embodiments, MTJs 130 are formed over the first electrode layer 110 and corresponding to the openings of the insulating layer 104, such that each MTJ 130 is vertically aligned with the corresponding first conductive feature 102. In some embodiments, The MTJ 130 includes a pinned layer 120 including ferromagnetic material, a tunnel barrier layer 122 including insulating material, a free layer 124 including ferromagnetic material, and a conductive cap 126. For example, the pinned layer 120 is electrically connected to the first electrode layer 110. The free layer 124 is over the pinned layer 120. The tunnel barrier layer 122 encapsulates the free layer 124, such that the top and bottom surfaces and sidewalls of the free layer 124 are covered by the tunnel barrier layer 122. The conductive cap 126 is over the free layer 124. The conductive cap 126 and the pinned layer 120 are isolated from the free layer 124 by the tunnel barrier layer 122. In some embodiments, the ferromagnetic material includes Fe, Co, Ni, an alloy thereof, or a combination thereof. In some embodiments, the insulating material includes MgO, $Al_2O_3$, NiO, $Ta_2O_3$, or another suitable dielectric material. In some embodiments, the conductive cap 126 made be made of ruthenium (Ru).

As shown in FIG. 1A, in some embodiments, a second electrode 140 (e.g., a top electrode) formed from a second electrode layer (not shown) is over the MTJ 130. For example, the second electrode layer may be made of tantalum (Ta), TaN, TiN, or a combination thereof. The second electrode layer may be formed by a PVD process, a CVD process, an ALD process, or another suitable method.

As shown in FIG. 1A, in some embodiments, a hard mask layer is formed over the second electrode layer on MTJ stack films (not shown) to define the second electrode 140 and the MTJ 130 thereunder. For example, the hard mask layer may include a silicon nitride layer 142 and an overlying tantalum (Ta) layer 144. In some embodiments, the second electrode 140 and the MTJ 130 have a tapered sidewall. In these cases, the sidewall slope angle of the second electrode 140 and the MTJ 130 is controlled by the hard mask layer including layers 142 and 144. In some embodiments, the second electrode layer is made of Ta. In these cases, fluorine-based or chlorine-based etching gas is not used for the definition of the second electrode 140. When the fluorine-based etching gas is used for the definition of the second electrode 140 that is made of TiN, poor critical dimension (CD) or profile control of the MTJ occurs because it is difficult to pattern the TiN layer by the fluorine-based etching gas. When the chlorine-based etching gas is used for the definition of the second electrode 140 that is made of TiN, chlorine atoms are easily diffused through the TiN layer to react with the MgO layer (i.e., the tunnel barrier layer 122), so that the MTJs 130 may peel off the underlying layer.

As shown in FIG. 1B, insulating spacer layers 150 and 152 are successively and conformally formed on the first electrode layer 110, in accordance with some embodiments. The insulating spacer layer 150 covers the top surface of the tantalum layer 144 and surrounds the sidewalls of the hard mask layer including layers 142 and 144, the second electrode 140, and the MTJ 130. In some embodiments, the insulating spacer layer 150 is used as an etch mask for defining a first electrode under the MTJ 140, and protects the MTJ 140 from damage during the fabrication of the semiconductor device structure. Moreover, the insulating spacer layer 152 is used as a sacrificial layer for the insulating spacer layer 150 when defining the first electrode. In some embodiments, the insulating spacer layer 150 is made of a material that is different from that of the insulating spacer layer 152. For example, the insulating spacer layer 150 is made of a silicon nitride, and the insulating spacer layer 152 is made of a silicon oxide, such as a TEOS oxide. In these cases, the insulating spacer layers 150 and 152 may be formed by a CVD process, an LPCVD process, a PECVD process, a HDPCVD process, or another suitable method.

As shown in FIG. 1C, the first electrode layer 110 is defined to form a first electrode 110a, in accordance with some embodiments. In some embodiments, an anisotropic etching process is performed on the spacer layers 152 and 150 to form insulating spacers 150a. Each insulating spacer 150a surrounds sidewalls of the corresponding silicon nitride layer 142, second electrode 140, and MTJ 130. After the anisotropic etching process is performed, the insulating spacer layer 152, the tantalum layer 144, and portions of the first electrode layer 110 are removed to form the first electrode 110a (e.g., bottom electrode) under the corresponding MTJ 130. As a result, MRAM devices are completed and correspondingly disposed over and electrically connected to the underlying first conductive features 102. In some embodiments, each MRAM device includes a first electrode 110a electrically connected to the first conductive feature 102, an MTJ 130 over the first electrode 110a, a second electrode 140 over the MTJ 130, and an insulating spacer 150a on the first electrode 110a and surrounding sidewalls of the MTJ 130 and the second electrode 140. In some embodiments, the MTJ 130 of the each MRAM device is vertically aligned with the corresponding first conductive feature 102.

Figure 1D:
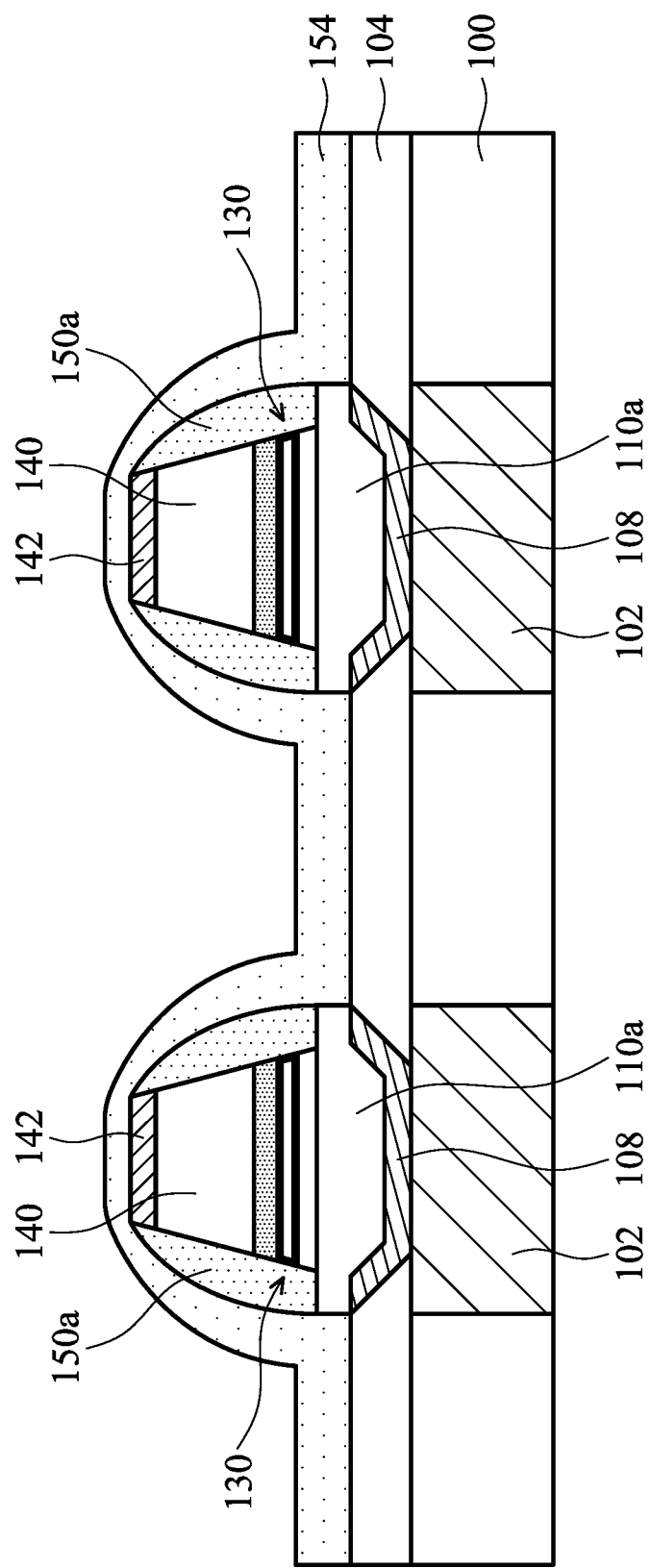

As shown in FIG. 1D, an insulating spacer layer 154 is formed over the structure shown in FIG. 1C, in accordance with some embodiments. For example, the insulating spacer layer 154 is conformally formed over the insulating layer 104, the insulating spacers 150*a*, and the silicon nitride layers 142. The combination of the insulating spacer 150*a* and the insulating spacer layer 154 further protects the MTJ 130 of the MRAM device. In some embodiments, the insulating spacer layer 154 is made of silicon nitride and is formed by a CVD process, an LPCVD process, a PECVD process, a HDPCVD process, or another suitable method.

Figure 1E:
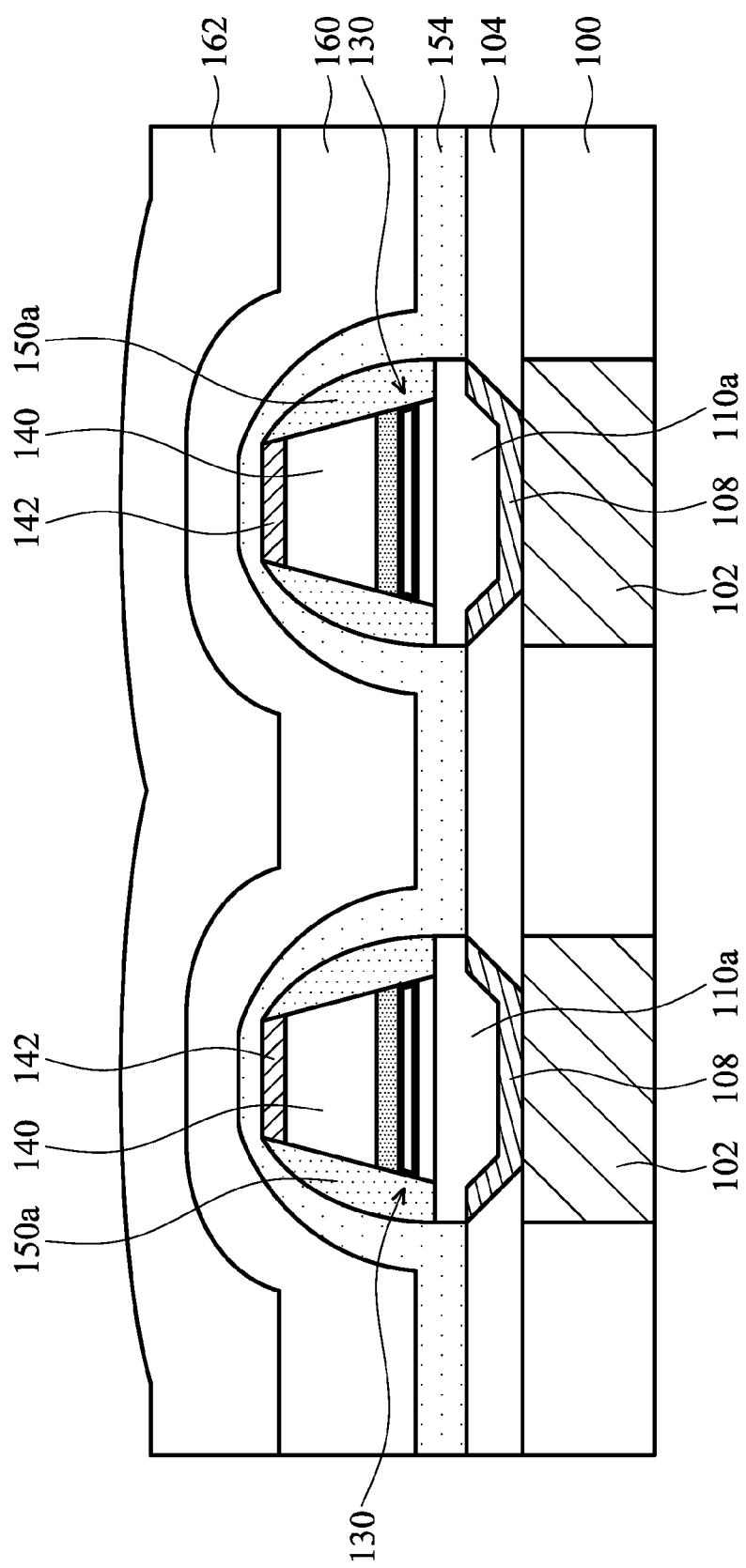

As shown in FIG. 1E, a planarization layer is formed over the structure shown in FIG. 1D, in accordance with some embodiments. The planarization layer may be a single layer or a multi-layer structure. For example, the planarization layer may include an insulating layer 160 formed over the insulating spacer layer 154 and a bottom anti-reflection coating (BARC) layer 162 formed over the insulating layer 160. In some embodiments, the insulating layer 160 fills the spaces between the adjacent MTJs 130. The insulating layer 160 may be made of a TEOS oxide and formed by a CVD process, an LPCVD process, a PECVD process, a HDPCVD process, or another suitable method. In some embodiments, the BARC layer 162 may be made of an inorganic material, such as silicon oxide, silicon nitride, silicon oxynitride, amorphous carbon (a-C), TiO, or TiON that is formed by a CVD process. Alternatively, the BARC layer 162 may be made of an organic material and formed by a spin-on process.

Figure 1F:
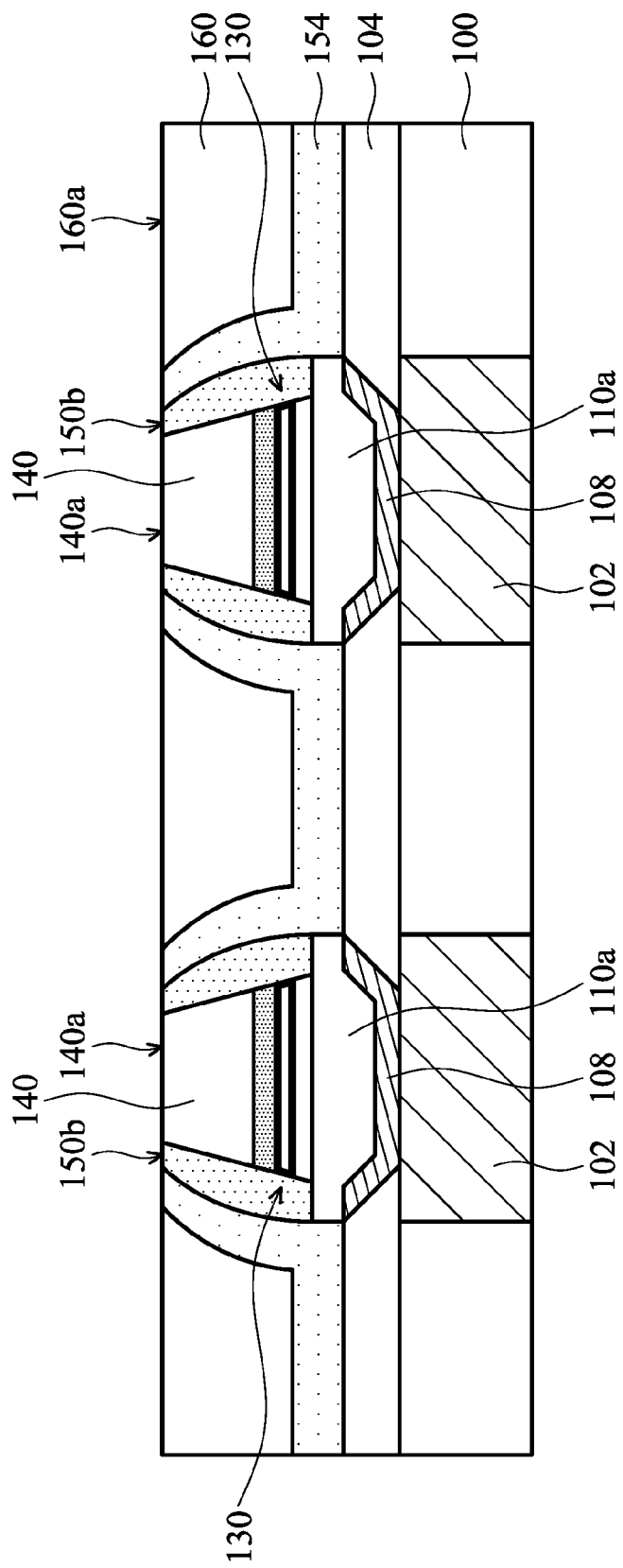

As shown in FIG. 1F, a planarization process is performed on the structure shown in FIG. 1E, in accordance with some embodiments. In some embodiments, the planarization process including an etching process and/or a chemical mechanical polishing (CMP) process is performed on the planarization layer including the BARC layer 162 and the insulating layer 160, such that the MRAM devices are in the etched and/or polished insulating layer 160 and a top surface 140*a* of the second electrode 140 and a top surface 150*b* of the insulating spacer 150*a* are exposed from a top surface 160*a* of the etched and/or polished insulating layer 160.

In some embodiments, after the planarization process is performed, the BARC layer 162 and the silicon nitride layer 142 are entirely removed. Moreover, the insulating layer 160, the insulating spacer layer 154, and the insulating spacer 150*a* are partially removed. As a result, the top surface 140*a* of the second electrode 140 and the top surface 150*b* of the insulating spacer 150*a* are substantially level with the top surface 160*a* of the etched and/or polished insulating layer 160.

In some embodiments, the second electrode 140 is made of Ta to prevent poor MTJ CD control and MTJ peeling defects as mentioned above. In these cases, an in-situ cleaning process, such as an etching process, is performed on the second electrode 140. The top surface 140*a* of the second electrode 140 made of Ta is oxidized to form a tantalum oxide film (not shown) thereon after the planarization process is performed. The tantalum oxide film may increase the contact resistance (Rc) between the second electrode 140 and the overlying conductive layer. Accordingly, in some embodiments, the tantalum oxide film on the second electrode 140 is removed after performing the in-situ cleaning process, thereby preventing the contact resistance from increasing.

Figure 1G:
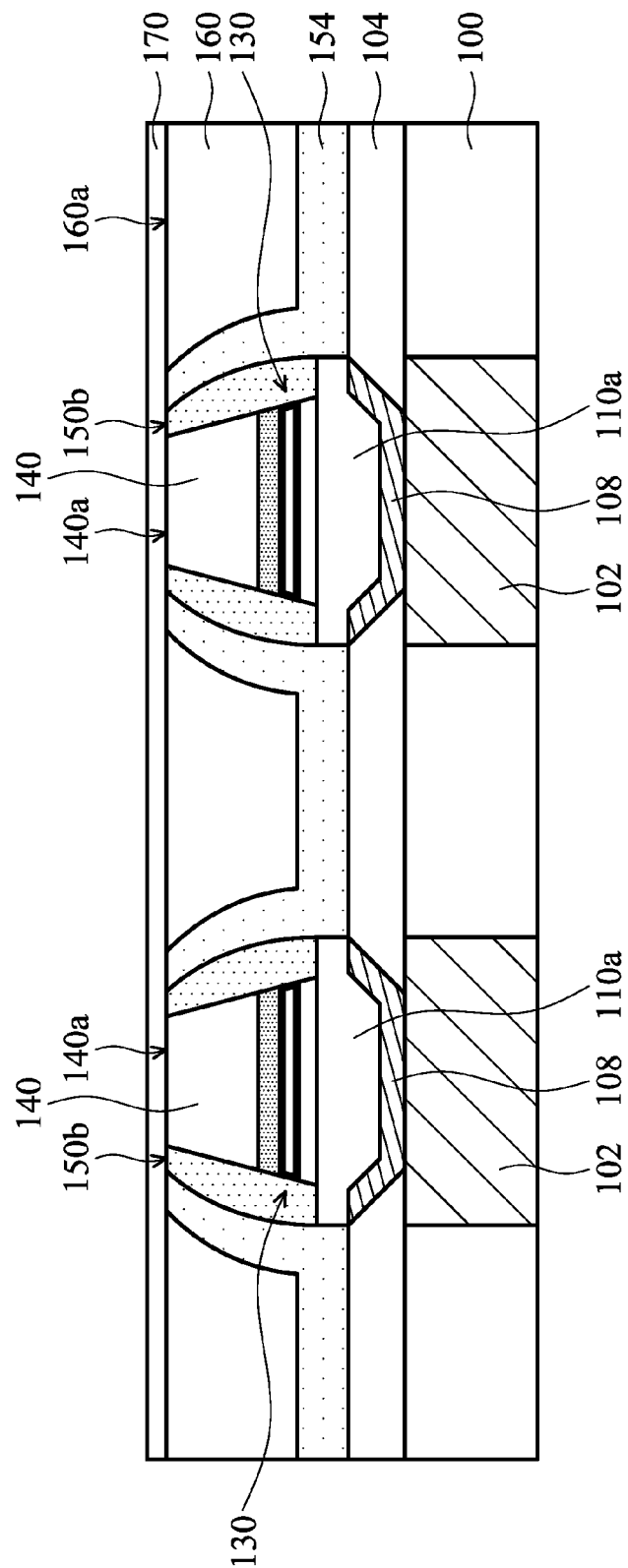
Figure 1H:
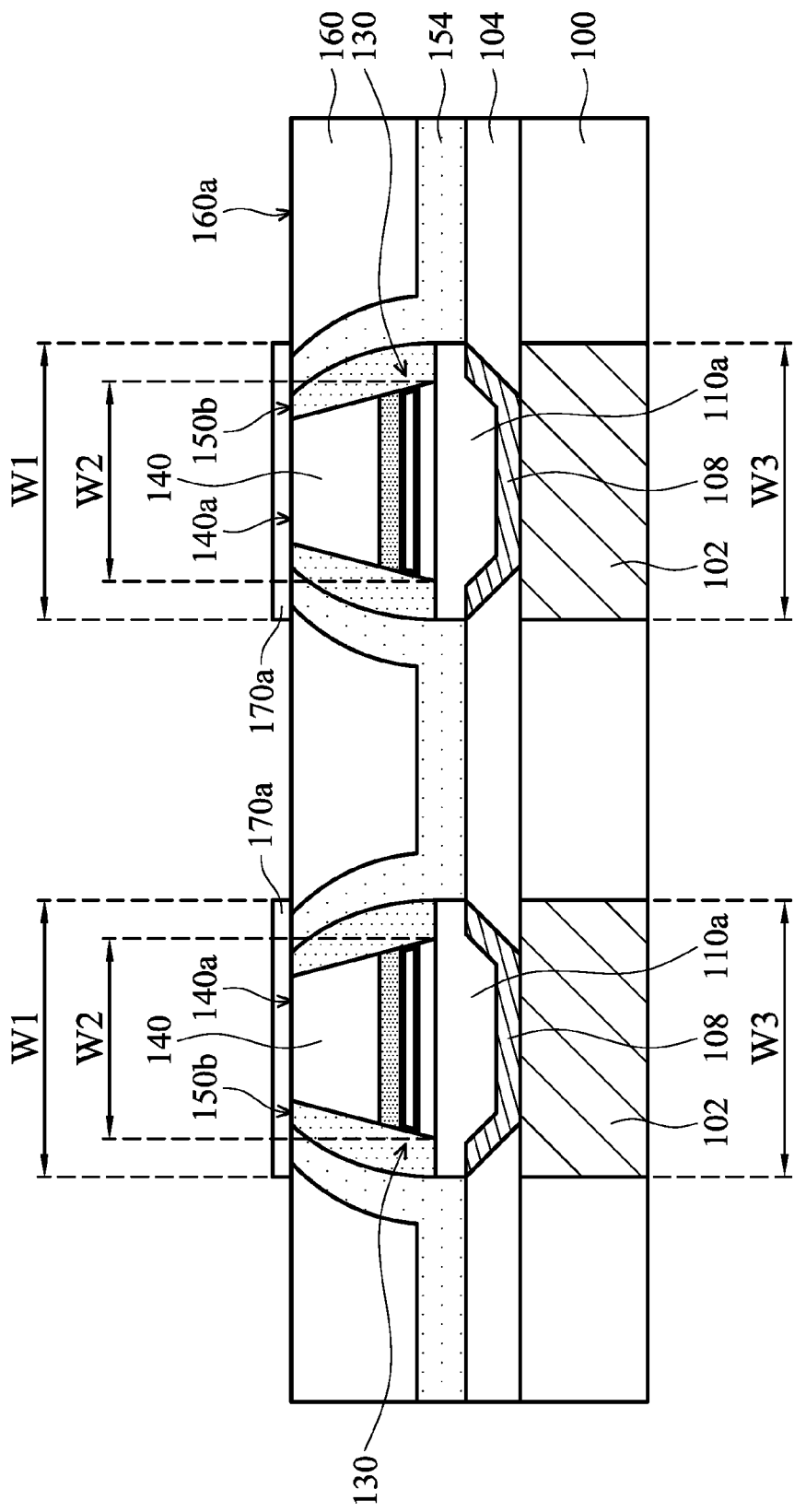

As shown in FIGS. 1G to 1H, conductive pads are formed after performing the in-situ cleaning process, in accordance with some embodiments. In FIG. 1G, a conductive layer 170 is formed on the structure shown in FIG. 1F by an in-situ deposition process, such that the conductive layer 170 is in direct contact with and electrically connected to the second electrode 140. In some embodiments, the conductive layer 170 is made of TiN and is formed by a PVD process, a CVD process, an ALD process, or another suitable method.

Figure 1I:
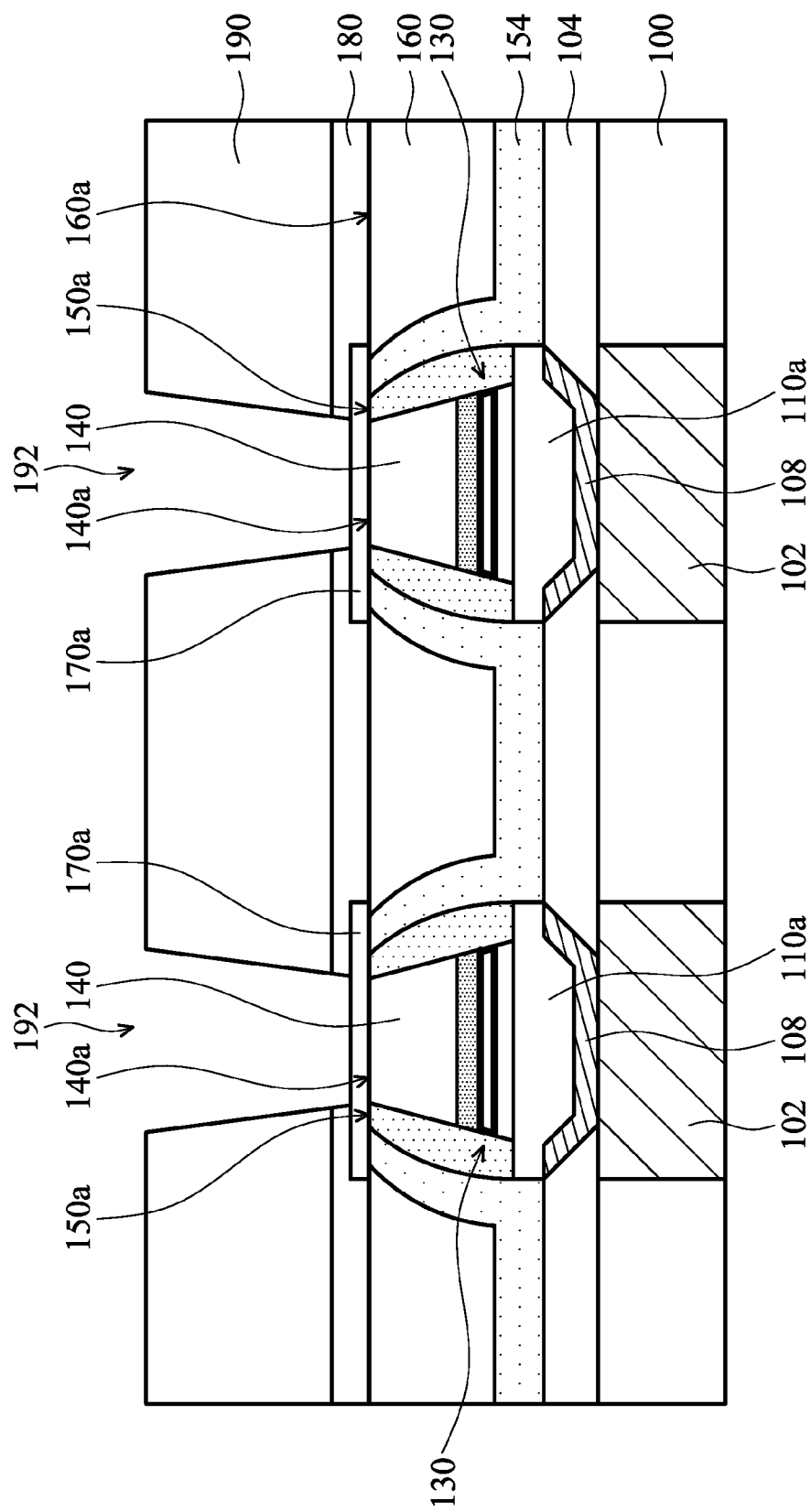

In FIG. 1H, the conductive layer 170 is patterned by an etching process to form conductive pads 170*a* corresponding to the MRAM devices and the first conductive features 102 thereunder, such that each MTJ 130 is entirely covered by the corresponding conductive pad 170*a*. In some embodiments, the conductive pad 170*a* has a width W1 not less than a width W2 of the corresponding MTJ 130. For example, the conductive pad 170*a* has a width W1 greater than a width W2 of the corresponding MTJ 130. In this case, the conductive pad 170*a* protects the tunnel barrier layer 122 of the MTJ 130 thereunder from damage in the subsequent etching process (as shown in FIG. 1I) for forming an overlying conductive feature. In some embodiments, each conductive pad 170*a* has a sufficient thickness in order to sustain such an etching process for formation of the conductive feature. In these cases, if the conductive pad 170*a* is too thick, the space between the adjacent conductive pads 170*a* has a high aspect ratio (AR) that may induce gap-filling problems in subsequent processes. In some embodiments, in order to effectively protect the tunnel barrier layer 122, while preventing gap-filling problems, each conductive pad 170*a* has a thickness in a range of about 50 nm to 250 nm.

In some embodiments, the first conductive feature 102 under the corresponding MTJ 130 is also entirely covered by the corresponding conductive pad 170*a*. In these cases, the conductive pad 170*a* also has a width W1 not less than a width W3 of the corresponding first conductive feature 102.

Figure 1J:
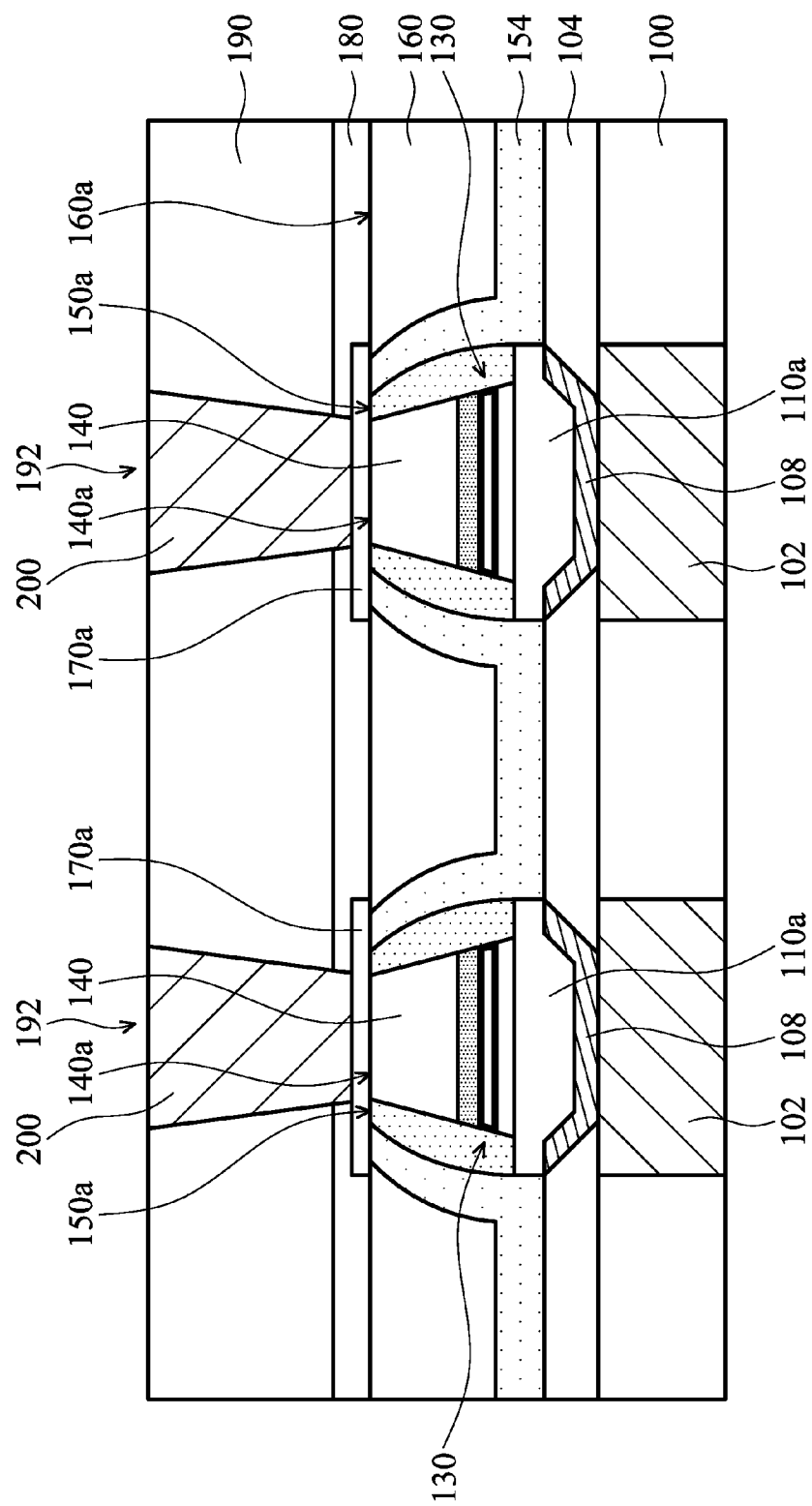

As shown in FIGS. 1I to 1J, conductive features are formed over and electrically connected to the MRAM devices, respectively, in accordance with some embodiments. In FIG. 1I, an IMD layer including an etch stop layer 180 and an overlying insulating layer 190 is formed over the structure shown in FIG. 1H. In some embodiments, the etch stop layer 180 includes silicon carbide, silicon nitride, silicon oxynitride, another suitable insulating material, or a combination thereof. In some embodiments, the etch stop layer 180 is formed by a CVD process, an LPCVD process, a PECVD process, a HDPCVD process, or another suitable method. In some embodiments, the material and the formation method of the insulating layer 190 may be the same as or similar to these of the insulating layer 100. In some embodiments, the insulating layer 190 may include a TEOS oxide layer and an overlying low k dielectric layer.

In some embodiments, the IMD layer including layers 180 and 190 is patterned by an etching process to form openings 192 corresponding to and exposing the conductive pads 170*a*, respectively. In some embodiments, since the conductive pad 170*a* has a width greater than that of the MTJ 130 thereunder, the sidewall of the MTJ 130 can be protected from damage when misalignments and/or over etching of the openings 192 occur.

As shown in FIG. 1J, a conductive material fills each opening 192 to form a second conductive feature 200 over and electrically connected to the conductive pad 170*a* in the bottom of each opening 192. In some embodiments, the material and the formation method of the second conductive feature 200 may be the same as or similar to these of the insulating layer 100. In some embodiments, each second conductive feature 200 is vertically aligned with the corresponding MTJ 130 thereunder, such that the first conductive feature 102, the corresponding MTJ 130, and the corresponding second conductive feature 200 are vertically aligned with each other.

FIGS. 2A to 2G are cross-sectional views of various stages of a method for forming a semiconductor device structure, in accordance with some embodiments. Descriptions of elements of the embodiments hereinafter that are the same as or similar to those previously described with reference to FIGS. 1A to 1J may be omitted for brevity. Additional operations can be provided before, during, and/or after the stages described in FIGS. 2A to 2G. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
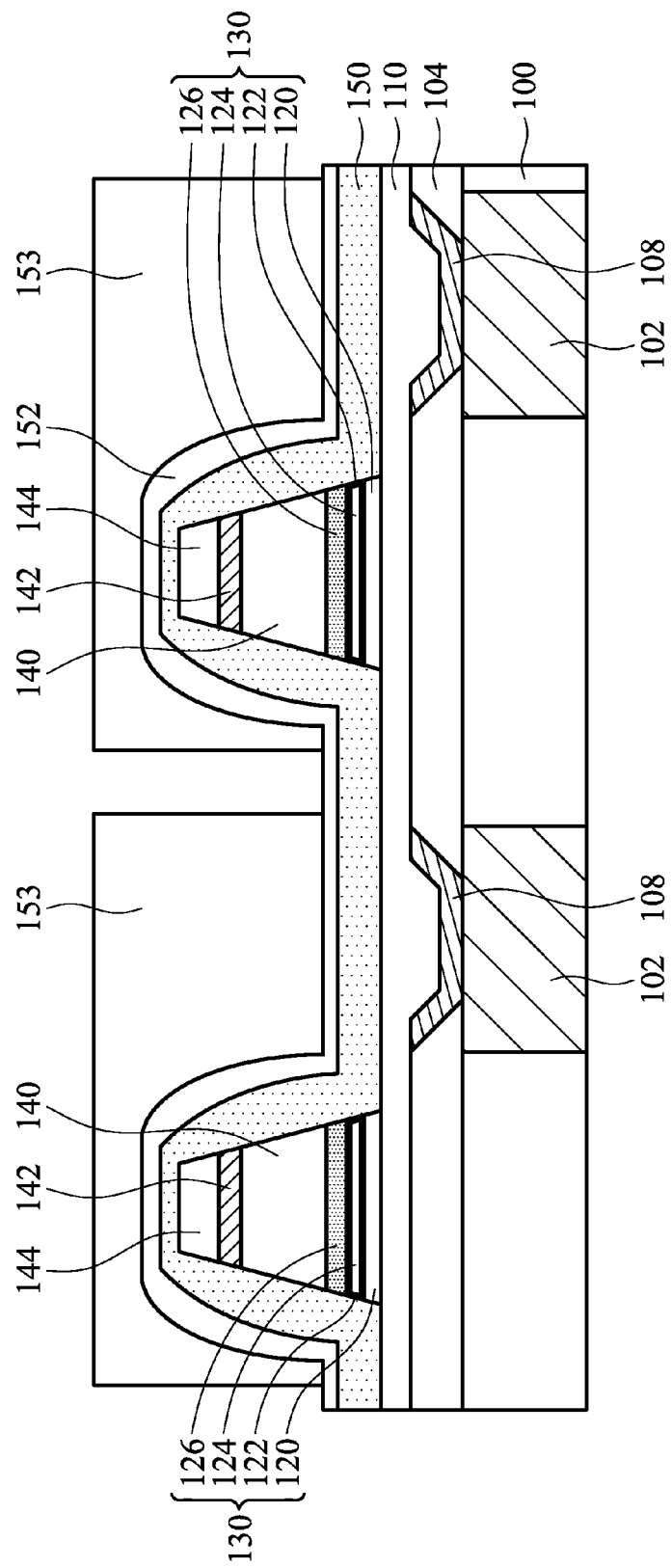
FIGS. 2A to 2G are cross-sectional views of various stages of a method for forming a semiconductor device structure, in accordance with some embodiments.
Figure 2B:
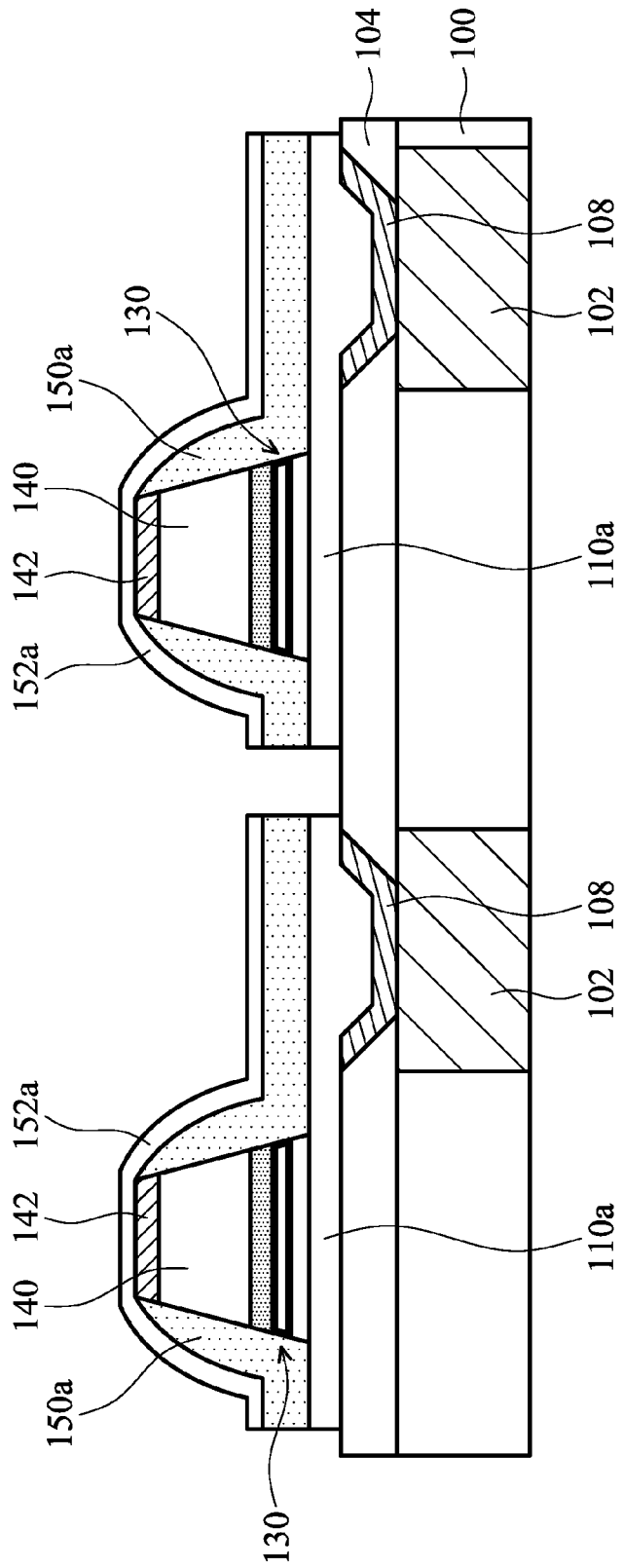
Figure 2C:
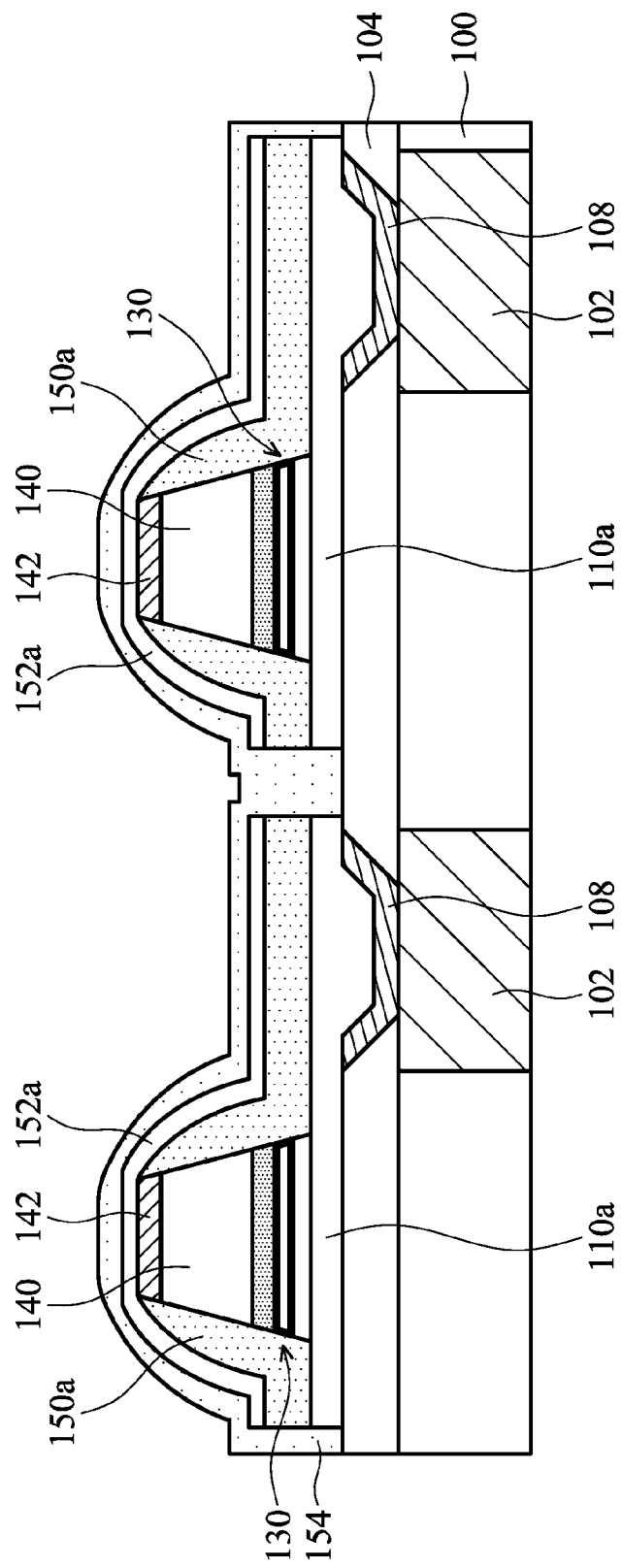
Figure 2D:
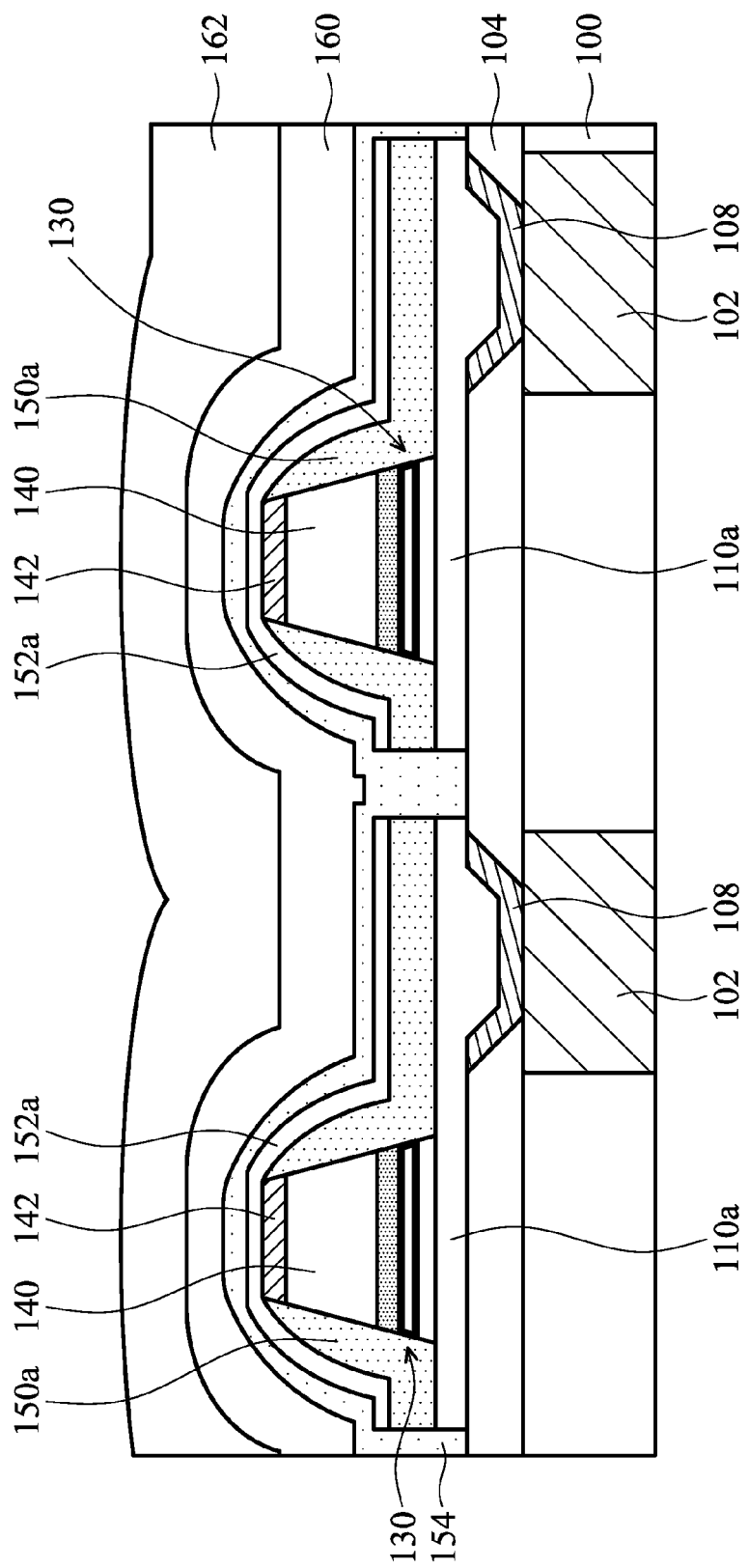
Figure 2E:
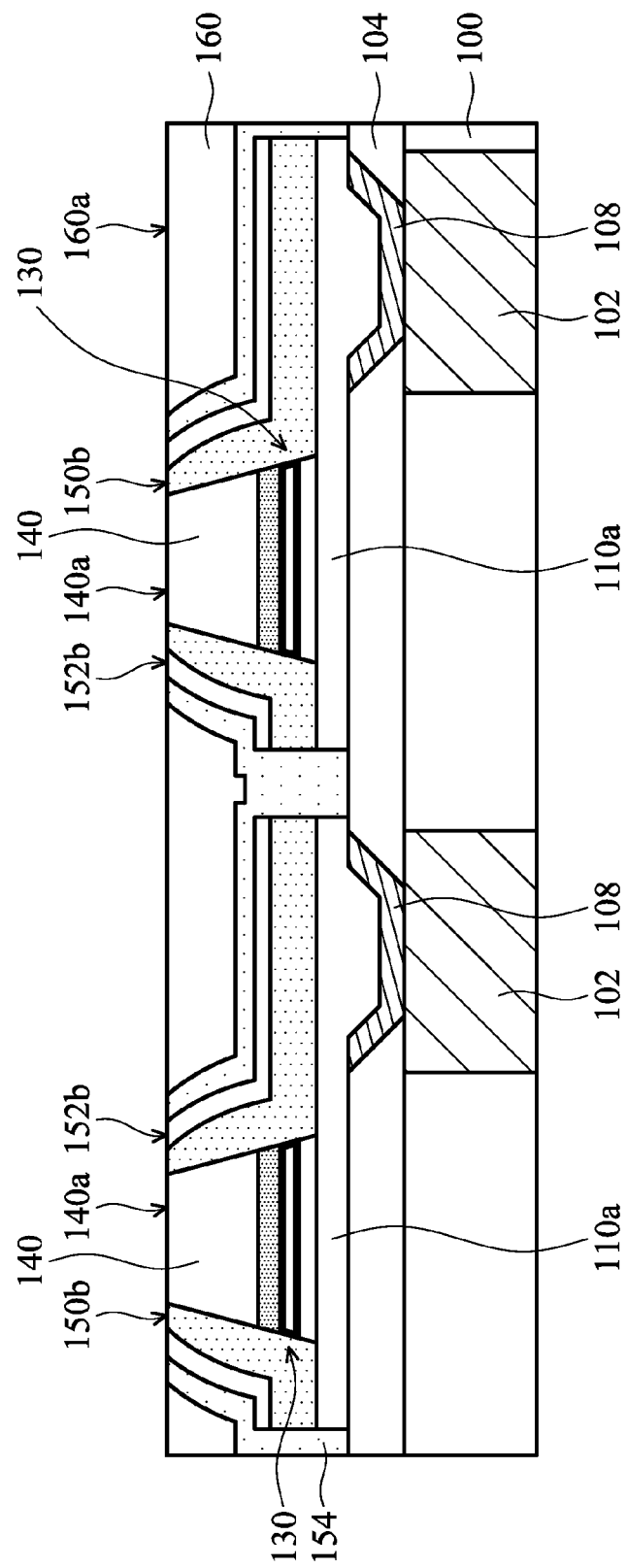
Figure 2F:
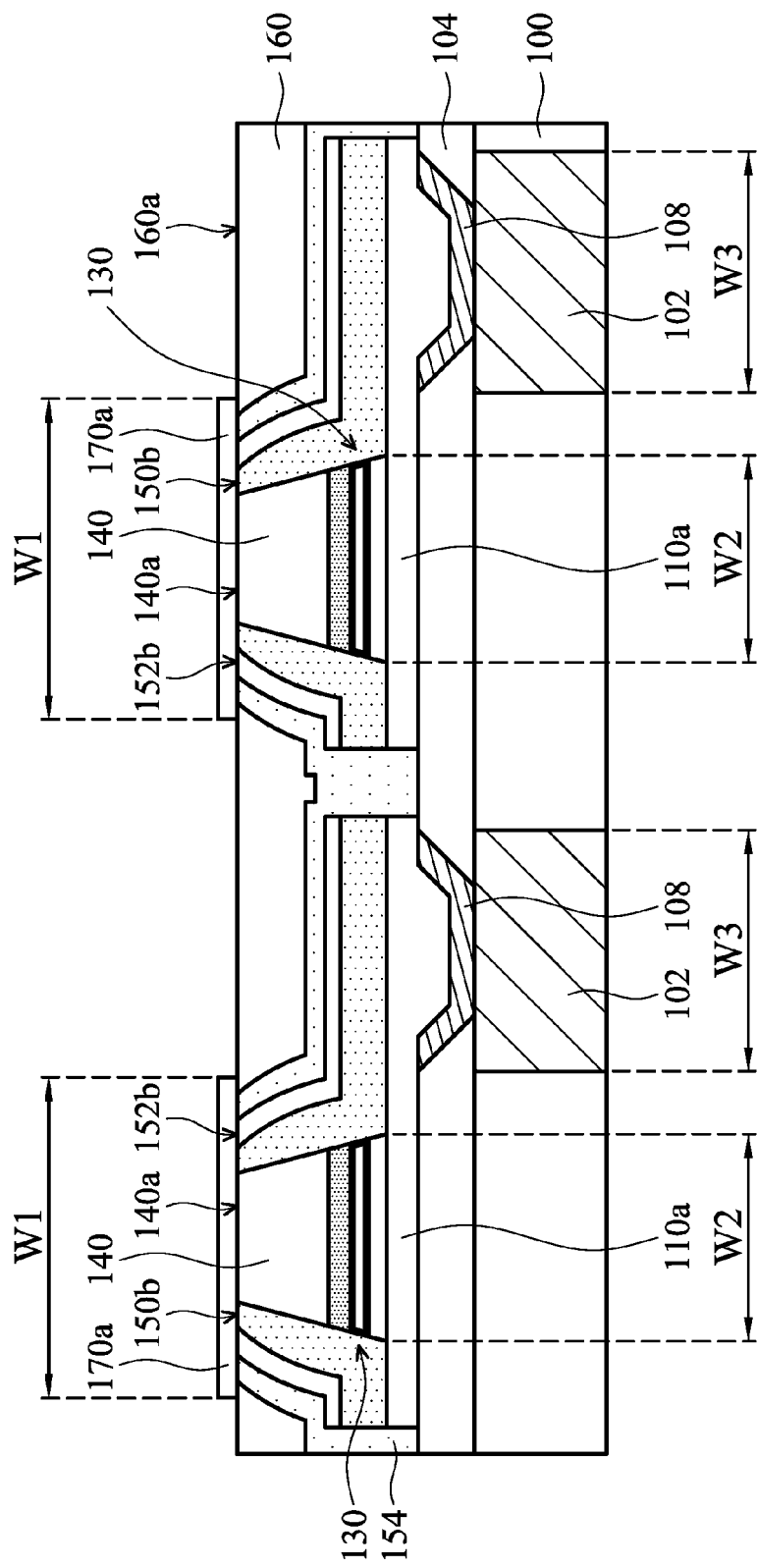
Figure 2G:
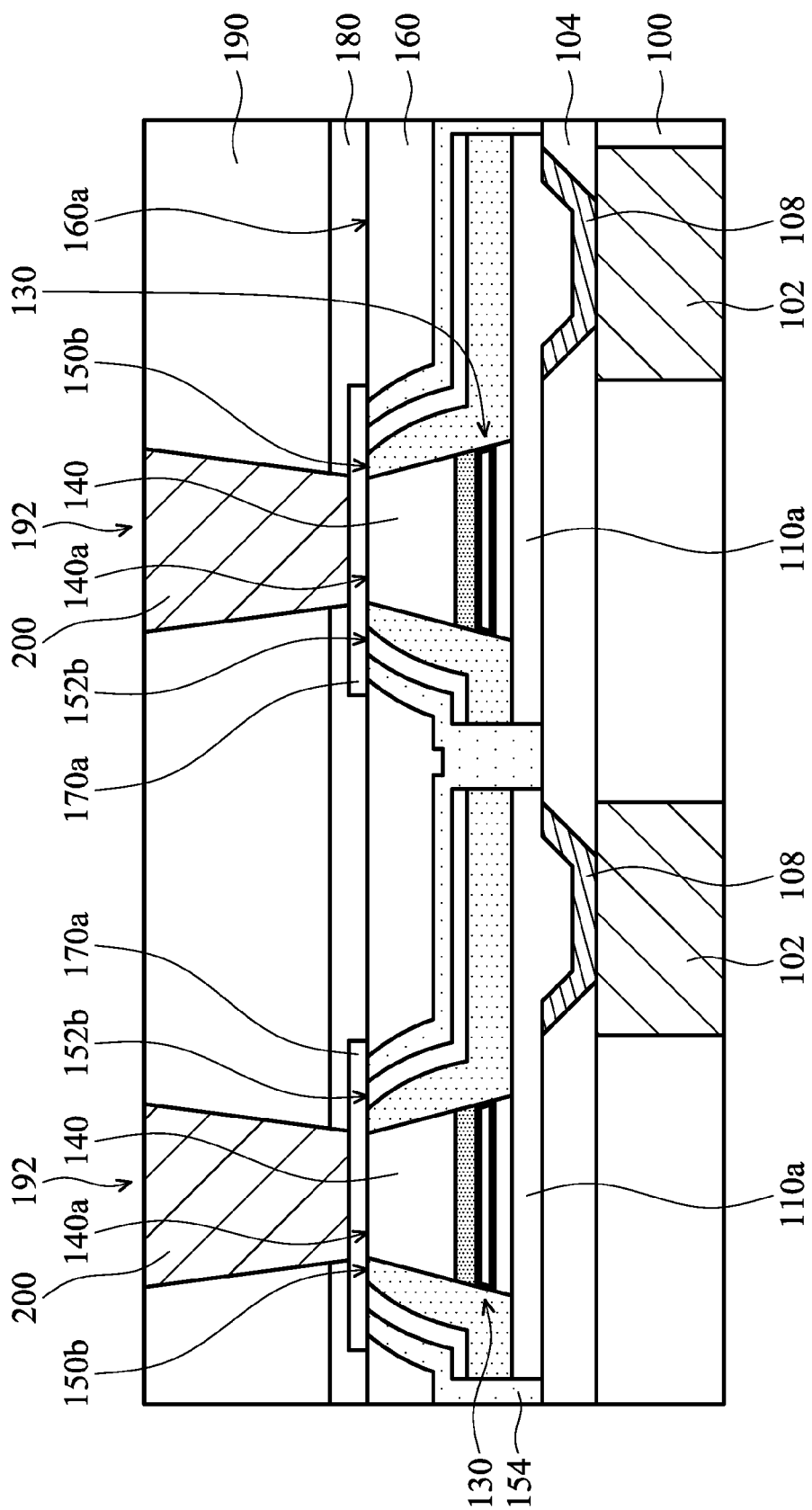

In some embodiments, the semiconductor device structure shown in FIG. 2G is similar to the semiconductor device structure shown in FIG. 1J and can be formed using a method that is the same as or similar to the method shown in FIGS. 1A to 1J. As shown in FIG. 2A, a structure to that is similar to the structure shown in FIG. 1B is provided. Unlike the structure shown in FIG. 1B, the hard mask layer including layers 142 and 144, the second electrode 140 under the hard mask layer, and the MTJ 130 under the second electrode 140 are laterally spaced apart from the corresponding first conductive feature 102, rather than being vertically aligned with the corresponding first conductive feature 102.

In some embodiments, a lithography process is performed to form masking layers 153 (e.g., photoresist layers) over the insulating spacer layer 152 for the definition of the first electrode. For example, each masking layer 153 covers one hard mask layer including layers 142 and 144, the second electrode 140 under the hard mask layer, the MTJ 130 under the second electrode 140, and the corresponding first conductive feature 102.

As shown in FIG. 2B, first electrodes are formed, in accordance with some embodiments. For example, an etching process is performed using the masking layers 153 as etch masks, so as to remove portions of the insulating spacer layers 152 and 150 and the underlying first electrode layer 110 that are uncovered by the masking layers 153. First electrodes 110a and insulating spacers 152a and 150a are formed after the etching process is performed, the overlying masking layers 153 are entirely removed during the etching process or after the etching process.

As shown in FIG. 2C, an insulating spacer layer 154 is formed over the structure shown in FIG. 2B, in accordance with some embodiments. For example, the insulating spacer layer 154 may be formed by a method that is the same as the method shown in FIG. 1D.

As shown in FIG. 2D, a planarization layer is formed over the structure shown in FIG. 2C, in accordance with some embodiments. For example, the planarization layer may include an insulating layer 160 formed over the insulating spacer layer 154 and a BARC layer 162 formed over the insulating layer 160, and the planarization layer including layers 160 and 162 may be formed by a method that is the same as the method shown in FIG. 1E.

As shown in FIG. 2E, a planarization process is performed on the structure shown in FIG. 2D, in accordance with some embodiments. In some embodiments, the planarization process is the same as the planarization process shown in FIG. 1F. After the planarization process is performed, the top surface 140a of the second electrode 140, the top surface 152b of the insulating spacer 152a, and the top surface 150b of the insulating spacer 150a are substantially level with the top surface 160a of the etched and/or polished insulating layer 160. In some embodiments, an in-situ cleaning process that is the same as the in-situ cleaning process shown in FIG. 1F is also performed on the second electrode 140.

As shown in FIG. 2F, conductive pads are formed after performing the in-situ cleaning process, in accordance with some embodiments. For example, conductive pads 170a are formed over the corresponding MRAM devices by a method that is the same as the method shown in FIGS. 1G to 1H, such that each MTJ 130 is entirely covered by the corresponding conductive pad 170a. In some embodiments, the conductive pad 170a has a width W1 not less than a width W2 of the corresponding MTJ 130. For example, the conductive pad 170a has a width W1 greater than a width W2 of the corresponding MTJ 130. In some embodiments, each conductive pad 170a has a thickness in a range of about 50 nm to 250 nm.

In some embodiments, the first conductive feature 102 under the corresponding MTJ 130 is also entirely covered by the corresponding conductive pad 170a. In these cases, the conductive pad 170a also has a width W1 not less than a width W3 of the corresponding first conductive feature 102.

As shown in FIG. 2G, conductive features are formed over and electrically connected to the MRAM devices, respectively, in accordance with some embodiments. For example, an IMD layer including an etch stop layer 180 and an overlying insulating layer 190 is formed over the structure shown in FIG. 2F by a method that is the same as the method shown in FIG. 1I. Afterwards, the IMD layer including layers 180 and 190 is patterned by an etching process to form openings 192 corresponding to and exposing the conductive pads 170a, respectively. In some embodiments, since the conductive pad 170a has a width greater than the MTJ 130 thereunder, the sidewall of the MTJ 130 can be protected from damage when misalignments and/or over etching of the openings 192 occur.

Afterwards, a conductive material fills each opening 192 to form a second conductive feature 200 over and electrically connected to the conductive pad 170a in the bottom of each opening 192. In some embodiments, the second conductive feature 200 is formed by a method that is the same as the method shown in FIG. 1J.

Embodiments of the disclosure provide semiconductor device structures and formation methods thereof. According to some embodiments of the disclosure, since there is no need to use a TiN layer as the top electrode of the MRAM device or as a hard mask to define the bottom electrode of the MRAM device, MTJ CD/profile control can be improved and the peeling defect of MTJ can be prevented. Moreover, since the top surface of the top electrode of the MRAM device is in-situ cleaned to remove an oxidized film thereon, the overlying conductive pad can be in direct contact with the top electrode that is free of an oxidized film thereon, thereby reducing the contact resistance between the top electrode and the overlying conductive feature. Additionally, since the conductive pad has a suitable thickness (e.g., in a range of about 50 nm to 250 nm) and a suitable width (e.g., greater than the width of the MTJ), gap-filling problems can be prevented and the sidewall of the MTJ of the MRAM device can be protected from damage during fabricating the semiconductor device structure.

In accordance with some embodiments, a semiconductor device structure is provided. The semiconductor device structure includes an MRAM device in an insulating layer. The MRAM device includes a first electrode, an MTJ over the first electrode, a second electrode over the MTJ, and an insulating spacer surrounding sidewalls of the MTJ and the second electrode. Top surfaces of the insulating spacer and the second electrode are exposed from the insulating layer. The semiconductor device structure also includes a conductive pad over the insulating layer and electrically connected to the second electrode. The MTJ is entirely covered by the conductive pad.

In accordance with some embodiments, a semiconductor device structure is provided. The semiconductor device structure includes a first conductive feature and an MRAM device in an insulating layer and over the first conductive feature. The MRAM device includes a first electrode electrically connected to the first conductive feature, an MTJ over the first electrode, a second electrode over the MTJ, and an insulating spacer surrounding sidewalls of the MTJ and the second electrode. Top surfaces of the insulating spacer, the second electrode, and the insulating layer are substantially level with each other. The semiconductor device structure also includes a conductive pad over the insulating layer and the MRAM device, and electrically connected to the second electrode. The conductive pad has a width greater than a width of the MTJ, such that the MTJ is entirely covered by the conductive pad. The semiconductor device structure further includes a second conductive feature over and electrically connected to the conductive pad.

In accordance with some embodiments, a method for forming a semiconductor structure is provided. The method includes forming an MRAM device over a first conductive feature. The MRAM device includes a first electrode electrically connected to the first conductive feature, an MTJ over the first electrode, a second electrode over the MTJ, and an insulating spacer surrounding sidewalls of the MTJ and the second electrode. The method also includes forming an insulating layer over the first conductive feature, such that the MRAM device is in the insulating layer and top surfaces of the second electrode and the insulating spacer are exposed from the insulating layer. The method also includes forming a conductive pad over the MRAM device and forming a second conductive feature over and electrically connected to the conductive pad. The conductive pad is electrically connected to the second electrode and the MTJ is entirely covered by the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a magnetoresistive random access memory (MRAM) device in an insulating layer, comprising:
        a first electrode;
        a magnetic tunnel junction (MTJ) over the first electrode, wherein the MTJ comprises a tunnel barrier layer encapsulating a free layer;
        a second electrode over the MTJ; and
        an insulating spacer surrounding sidewalls of the MTJ and the second electrode, wherein top surfaces of the insulating spacer and the second electrode are exposed from the insulating layer; and
    a conductive pad over the insulating layer and electrically connected to the second electrode, wherein the MTJ is entirely covered by the conductive pad.

2. The semiconductor device structure as claimed in claim 1, wherein the conductive pad has a width greater than a width of the MTJ.

3. The semiconductor device structure as claimed in claim 1, wherein the conductive pad is in direct contact with the second electrode.

4. The semiconductor device structure as claimed in claim 1, wherein the MTJ further comprises:
    a pinned layer electrically connected to the first electrode;
    the free layer over the pinned layer; and
    a conductive cap over the free layer, wherein the conductive cap and the pinned layer are isolated from the free layer by the tunnel barrier layer.

5. The semiconductor device structure as claimed in claim 1, wherein the conductive pad extends onto a top surface of the insulating layer.

6. The semiconductor device structure as claimed in claim 1, wherein the MTJ has a tapered sidewall.

7. The semiconductor device structure as claimed in claim 1, further comprising:
    a first conductive feature under and electrically connected to the first electrode of the MRAM device; and
    a second conductive feature over and electrically connected to the conductive pad.

8. The semiconductor device structure as claimed in claim 7, wherein the first conductive feature is entirely covered by the conductive pad.

9. The semiconductor device structure as claimed in claim 7, wherein the MTJ, the first conductive feature, and the second conductive feature are vertically aligned with each other.

10. The semiconductor device as claimed in claim 7, wherein the MTJ is laterally spaced apart from the first conductive feature.

11. A semiconductor device structure, comprising:
    a first conductive feature;
    a magnetoresistive random access memory (MRAM) device in an insulating layer and over the first conductive feature, comprising:
        a first electrode electrically connected to the first conductive feature;
        a magnetic tunnel junction (MTJ) over the first electrode;
        a second electrode over the MTJ, wherein top surfaces of the insulating spacer, the second electrode, and the insulating layer are substantially level with each other; and
        an insulating spacer surrounding sidewalls of the MTJ and the second electrode;
    a conductive pad over the insulating layer and the MRAM device, and electrically connected to the second electrode, wherein the conductive pad has a width greater than a width of the MTJ, such that the MTJ is entirely covered by the conductive pad; and
    a second conductive feature over and electrically connected to the conductive pad.

12. The semiconductor device structure as claimed in claim 11, wherein the MTJ is laterally spaced apart from the first conductive feature.

13. The semiconductor device structure as claimed in claim 11, wherein the MTJ, the first conductive feature, and the second conductive feature are vertically aligned with each other.

14. The semiconductor device structure as claimed in claim 11, wherein the conductive pad is in direct contact with the second electrode.

15. The semiconductor device structure as claimed in claim 11, wherein the conductive pad has a thickness in a range of about 50 nm to 250 nm.

16. A method for forming a semiconductor structure, comprising:
   forming a magnetoresistive random access memory (MRAM) device over a first conductive feature, wherein the MRAM device comprises:
      a first electrode electrically connected to the first conductive feature;
      a magnetic tunnel junction (MTJ) over the first electrode;
      a second electrode over the MTJ; and
      an insulating spacer surrounding sidewalls of the MTJ and the second electrode, wherein the formation of the MRAM device comprises forming a nitride layer over the second electrode before the insulating spacer is formed;
   forming an insulating layer covering the nitride layer and the MRAM device;
   polishing the insulating layer and the nitride layer to expose a top surface of the second electrode, thereby forming an oxide layer over the second electrode;
   removing the oxide layer; and
   forming a conductive pad over the second electrode; and
   forming a second conductive feature over and electrically connected to the conductive pad.

17. The method as claimed in claim 16, wherein the conductive pad has a width greater than a width of the MTJ.

18. The method as claimed in claim 16, wherein the top surfaces of the second electrode and the insulating spacer are exposed from and substantially level with a top surface of the insulating layer.

19. The method as claimed in claim 16, wherein the oxide layer is a tantalum oxide layer.

20. The method as claimed in claim 16, further comprising:
   forming a tantalum layer over the nitride layer before the insulating spacer is formed and removing the tantalum layer after the insulating spacer is formed, such that the insulating spacer is formed on sidewalls of the nitride layer.

* * * * *